Dec. 18, 1962 H. C. HELD 3,068,733

AUTOMATIC CONTROL IN FABRICATION OF PRINTED WIRING BOARDS

Filed Dec. 31, 1958

INVENTOR
H. C. HELD
BY Kenneth B. Hamlin
ATTORNEY 3,068,733

AUTOMATIC CONTROL IN FABRICATION OF PRINTED WIRING BOARDS

Harold C. Held, Villa Park, Ill., assignor to Bell Telephone Laboratories, Incorporated, New York, N.Y., a corporation of New York Filed Dec. 31, 1958, Ser. No. 784,262
3 Claims. (Cl. 83—371)

Figure 1:
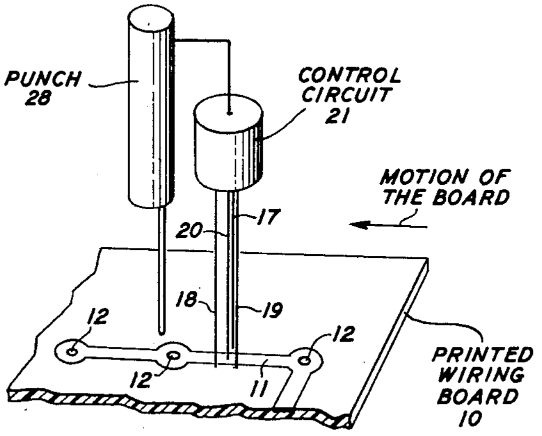

This invention relates to apparatus for the manufacture of printed wiring boards and more specifically to apparatus for controlling the punching of holes in printed wiring boards or, generally, for locating the positions along such boards where components are to be mounted.

Printed wiring boards for mounting and interconnecting components are in extensive use in the electronic field and are particularly useful where solid state electronic components are employed. This widespread use of printed wiring boards points out the need for fast and accurate methods of processing such boards. The present trend in printed wiring board design is to lay out the circuit on the board so that all holes are located on modular coordinates. This facilitates mass punching of holes and machine insertion of components.

One time consuming operation, however, in the handling of a printed wiring board is the locating of points where holes are wanted. Even though the holes are located on a grid system, such as, for example with a .2 inch spacing center to center, and an accurate master jig is provided to guide the drill or punch, a considerable amount of time is taken in locating the position of the holes. Further, a different template or jig is required for each type of board.

Priorly in the control of machinery, such as the hole drill or punch, external templates, external tape control, or other complicated external control mechanisms have been utilized. This has not only been relatively complex but has limited the flexibility of the apparatus as each board to be punched that has a slightly different pattern of holes requires a change in the control equipment.

It is an object of my invention to simplify the location of the points along a printed wiring board where a hole is to be punched or, if a hole is present, where a circuit component is to be placed by automatic machinery.

It is another object of my invention to increase the flexibility of machinery utilized in the processing of printed wiring boards by allowing subsequent boards to have differing patterns without requiring changes in the control circuits or mechanisms.

These and other objects of my invention are attained in a specific illustrative embodiment wherein the punching of holes through a printed wiring board is controlled by sensing hole locations directly from the printed wiring board being punched. Thus, in effect, each board is its own control tape or master template and no changes need be made for different hole patterns.

The printed wiring board to be punched by apparatus in accordance with my invention has on its surface a plurality of conductive strips or coatings. These strips have been placed on the board so as to have enlarged portions immediately surrounding the point, or area, where a hole is to be punched. At the same time during the coating or etching process the surface of the board directly at the point where the hole is to be punched has been left bare.

In accordance with my invention this point where the hole is to be punched is located and sensed electrically by four contact fingers or probes which are connected to a control circuit. Three of the fingers are positioned so that when the board, in its motion past the fingers, causes a point where a hole is to be punched to be under the fingers, these fingers rest on and are in electrical contact with the enlarged portion of the conductive strip. The fourth finger, which is normally in contact with the conductive strip, is centrally located so that at this instant it is on the bare board.

The control circuit in this specific illustrative embodiment includes a voltage source which is connected to the first finger and an AND gate having two enable terminals connected to the second and third fingers and an inhibit terminal connected to the fourth finger.

Advantageously the conductive strips are arranged on the board so that a number of holes may be drilled or punched at one time on different parallel strips. A sensing mechanism, as described above, may be utilized with each punch or drill or one sensing mechanism may control the punches of a number of conductive strips.

When the location of the point where a hole is to be drilled is identified, the board is then moved relative to the fingers so that the fingers are not at the point where the hole is to be punched, but instead this point is located under the punch or drill. The probes may be positioned 0.2 inch or more ahead of the punch; in a case where it is desired to locate holes quite close together along the printed wiring board, the fingers may be identifying the next hole location while the last location is being punched. Advantageously, the control circuit includes some delay between the output of the AND gate and the enablement of the punch mechanism to allow for the motion of the board, and, if desired, memory could also be provided.

After the holes have been punched, the board may have the components mounted thereon by automatic machinery, the presence of a hole being determined in the same manner by the four fingers or probes.

It is a feature of this invention that a plurality of conductive fingers or probes ride along a printed wiring board so that normally one finger is in contact with the conductive strip or coating of the board and the others are not but that at a location where a hole is to be punched or identified the one finger is not in contact with the conductive coating but the other fingers are in contact.

It is a further feature of this invention that the one finger be connected to the inhibit terminal of a gating circuit and at least one other of the fingers be connected to an enabling terminal of the gating circuit.

It is another feature of this invention that a potential be applied to the conductive strip or coating of the board at least at the time when it is desired to identify or locate the point where a hole is to be located or is present. More specifically, it is a feature of this invention that another of the fingers be connected to the source of potential.

It is a still further feature of this invention that the probes or fingers be so arranged that the one finger is centrally positioned at the location where the hole is to be and the other fingers are circumferentially placed around the one finger and in contact with an enlarged portion or land area of the conductive strip.

Figure 2:
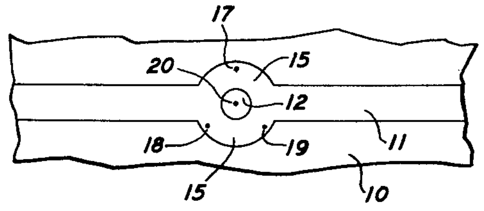
Figure 3:
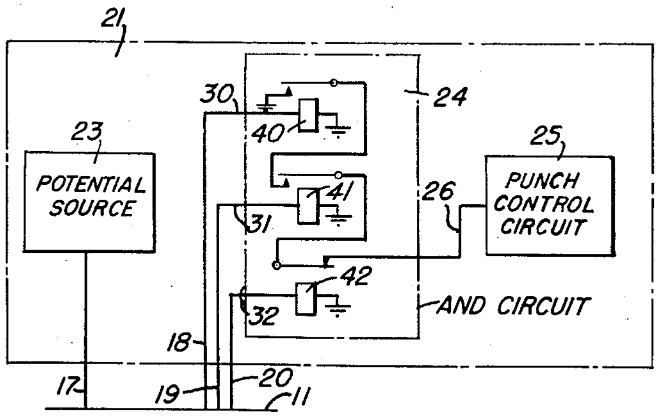

A complete understanding of these and various other features of my invention may be obtained from consideration of the following detailed description and accompanying drawing, in which:

FIG. 1 is a perspective view of a portion of a printed wiring board in which holes are to be punched and also depicts schematically the control apparatus in accordance with this invention;

FIG. 2 is a plan view of a portion of a conductive coating on the printed wiring board, showing particularly the configuration of the conductive coating at a location where a hole is to be punched and the positions of the ends of the conductive fingers when that location is being recognized by the control circuit; and FIG. 3 is a schematic representation of the control circuit of one specific illustrative embodiment of my invention for use with the apparatus of FIG. 1.

Referring now to the drawing, FIG. 1 depicts a portion of a printed wiring board 10 having a conductive coating 11 thereon defining the conductive path between components mounted on the board by leads extending through the holes drilled or punched at the points or locations 12, as is known in the art.

The board is prepared, by any of the techniques known in the art and usable for such purposes, so that at each point 12 where a hole is to be punched or drilled there is left a small uncoated portion 12, best seen in FIG. 2. At the same time the coating 11 has enlarged semi-circular portions 15 encompassing this area 12. The enlarged portions of the conductive strip where components are to be mounted are often referred to as lands.

In accordance with an aspect of my invention this land is recognized and identified without the necessity for external master templates or programming tapes. Specifically in the specific embodiment depicted in the drawing, four flexible probes 17, 18, 19, and 20 are connected to a control circuit 21. As seen in FIG. 2, wherein the ends of the probes resting on the board 10 are indicated by the reference numerals, the probes are arranged so that probes 17, 18, and 19 normally are resting on the surface of the board 10 as the board is moved, by means known in the art but not shown in the drawing, under the probes and not on the coating 11, while probe 20 is normally in contact with the coating 11. However, at a land where it is desired to punch a hole through the board, the contacts are in the positions seen in FIG. 2. In this case, the probes 17, 18, and 19 are all contacting the portions 15 of the coating 11 whereas the probe 20 is contacting the unlocated area or point 12. As seen in the drawing, the probes are arranged so that probe 20 is centrally positioned while probes 17, 18, and 19 are circumferentially positioned around the probe 20 and are equidistant from each other.

FIG. 3 depicts one specific embodiment of a control circuit 21 wherein these probes determine where a hole is to be punched. As seen in FIG. 3, a potential source 23 applies a voltage or signal to the conductive strip 11 when probe 17 is contacting the coating or strip 11. At the same time probes 18 and 19 apply this voltage as enabling signals to enabling terminals 30 and 31 of AND gate 24. However, if the probe 20 is also in contact with the coating 11, an inhibit signal is applied to the inhibit terminal 32 of the AND gate 24 preventing an output signal being applied to the punch control circuit 25. When a hole is to be punched, the probe or finger 20 should be in contact with the uncoated area or point 12 and thus insulated from the coating 11 so that no inhibit signal is applied.

The AND gate 24 in this one specific illustrative embodiment is shown to comprise three relays, 40, 41, and 42. Relays 40 and 41 are associated with the enable terminals 30 and 31 and relay 42 with the inhibit terminal 32. When the probes 18 and 19 engage a conducting portion of the printed wiring board 10, a path is completed from the potential source 23 through the probe 17, the conducting portion of the printed wiring board 11, through probes 18 and 19, respectively, to the windings of relays 40 and 41. When the probe 20 engages the conducting portion 11 of the printed wiring board, a similar path is completed from the potential source 23 to the windings of the inhibit relay 42. When a point to be punched is reached and probes 17, 18, and 19 all fall on the conducting portion 15 of the printed wiring board 10, and probe 20 falls on an insulated portion of the board at point 12, relays 40 and 41 become operated and relay 42 is released. A path is then completed from ground through make contacts of relays 40 and 41 and the break contact of relay 42 to the output terminal 26 and thence to the punch control circuit 25. If probe 20 contacts a conducting portion of the printed wiring board 10, relay 42 operates and the enabling circuit for the punch control circuit is broken.

Although a relay AND circuit has been shown in this one specific illustrative embodiment, it is recognized that electronic AND circuits, such as diode gates, transistor gates or combinations thereof may also be employed.

Activation of the punch control circuit 25, which may include a suitable delay circuit, causes the relative motion of the board with respect to the punch and probes to continue a sufficient amount to allow the probes to be removed from the location 12 at which the hole is to be punched and also causes the punch to make a hole at the indicated point. The board would then be moved until the probes identified the next point 12 at which point the above process would be repeated.

The utilization of these probes in accordance with my invention allows for some movement of each probe to allow for uneven solder coating. The size of the hole to be punched and of the land impose no problems of identification by the probes. The smallest practical hole size to punch in a printed wiring board is presently estimated at .053 inch diameter. The typical land diameter for this hole, being the outer diameter of the semicircular portions 15, could be .109 inch. The uncoated area or point 12 in the land should be several mils smaller than the punched hole and a diameter of .040 inch may be employed. For such a specific example, the probes 17, 18, and 19 may be located .036 inch from the center of the land, at which center point the probe 20 is located. The probes themselves may each be a wire of .005 inch diameter. In this specific example, the relative displacement of the land center to the center of the probe arrangement could be as great as 0.017 inch before an error in reading would occur. Such a tolerance is well within the present tolerances obtained by known techniques in preparing and processing printed wiring boards.

By utilizing arrangements in accordance with my invention wherein the hole locations are sensed directly from the printed circuit board itself rather than from an external control, such as a paper or magnetic tape, many advantages may be realized. Thus a great deal of time required to prepare such tapes may be saved, and space requirements for storing a large number of such prepared programs become unnecessary. The inconvenience of changing tapes, or templates, each time a different lot of boards is to be processed is obviated. Boards of a given size, or even of different sizes, can be fed into the apparatus in any order. This becomes of particular importance when it is desired to process a few, such as possibly only one or two, boards needed for a particularly urgent job in the midst of a long run of circuit boards of a different type.

While a specific embodiment of this invention has been illustrated and described above, it is to be understood that it is but illustrative of the application of the principles of the invention. Numerous other arrangements may be devised by those skilled in the art without departing from the spirit and scope of the invention.

What is claimed is:

1. Apparatus for controlling the automatic punching of holes in a printed wiring board having a long conductive strip thereon, comprising a punch control circuit, a gate circuit having at least an enabling and an inhibit terminal and an output terminal connected to said punch control circuit, means for applying current to the conductive strip of the board, current conductive finger means connected to said inhibit terminal and current conductive finger means connected to said enabling terminal, said inhibit terminal finger means being offset from said enabling terminal finger means with reference to the path of motion of the conductive strip relative to said finger means, whereby said current is applied to said enabling terminal but not to said inhibit terminal at the location where a hole is to be punched.

2. Apparatus for controlling the automatic punching of holes in a printed wiring board having a long conductive strip thereon and a plurality of enlarged lands along the length thereof, the lands being conductively connected to the long conductive strip and the lands each surrounding a nonconductive portion of the board where holes are to be punched, comprising a punch control circuit, a gate circuit having a plurality of enabling terminals, an inhibit terminal and an output terminal connected to said punch control circuit, means for applying current to the conductive strip of the board, means for applying said current to said plurality of enabling terminals and to said inhibit terminal whereby said current is applied to said plurality of enabling terminals but not to said inhibit terminal at the location where a hole is to be punched, said both means for applying current to said terminals including fingers adapted to ride on the board, said finger connected to said inhibit terminal being offset from said fingers connected to said enabling terminals with reference to the path of motion of the conductive strip relative to said finger means.

3. Apparatus for controlling the automatic punching of holes in a printed wiring board in accordance with claim 2 wherein said fingers for applying current to said plurality of enabling terminals include three fingers circumferentially spaced and wherein said finger for applying current to said inhibit terminal is centrally located within the circle defined by said circumferentially spaced fingers, whereby said circumferentially spaced fingers all conductively engage a land at a point where a hole is to be punched and said centrally located finger does not contact the land.

References Cited in the file of this patent

UNITED STATES PATENTS

| | | |
|---|---|---|
| 918,813 | Armstrong | Apr. 20, 1909 |
| 2,170,609 | Nedal | Aug. 22, 1939 |
| 2,652,864 | De Anguera | Sept. 22, 1953 |